United States Patent
Loubet et al.

(10) Patent No.: US 9,917,194 B2
(45) Date of Patent: Mar. 13, 2018

(54) SELF-ALIGNED SILICON GERMANIUM FINFET WITH RELAXED CHANNEL REGION

(71) Applicant: STMicroelectronics, Inc., Coppell, TX (US)

(72) Inventors: Nicolas Loubet, Guilderland, NY (US); Pierre Morin, Albany, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/365,640

(22) Filed: Nov. 30, 2016

(65) Prior Publication Data

US 2017/0084733 A1    Mar. 23, 2017

Related U.S. Application Data

(62) Division of application No. 14/755,663, filed on Jun. 30, 2015, now Pat. No. 9,548,361.

(51) Int. Cl.
*H01L 29/78* (2006.01)
*H01L 27/088* (2006.01)
(Continued)

(52) U.S. Cl.
CPC ........ *H01L 29/785* (2013.01); *H01L 27/0886* (2013.01); *H01L 29/0623* (2013.01);
(Continued)

(58) Field of Classification Search
CPC ........... H01L 29/1054; H01L 29/66545; H01L 29/785; H01L 29/41791; H01L 29/6656;
(Continued)

(56) References Cited

U.S. PATENT DOCUMENTS 8,211,772 B2   7/2012   Kavalieros et al.
8,759,874 B1   6/2014   Loubet et al.
(Continued)

OTHER PUBLICATIONS

Loubet et al., "Co-Integration of Tensile Silicon and Compressive Silicon Germanium," U.S. Appl. No. 14/833,857, filed Aug. 24, 2015, 27 pages.

*Primary Examiner* — Evan Pert
*Assistant Examiner* — Changhyun Yi
(74) *Attorney, Agent, or Firm* — Seed Intellectual Property Law Group LLP

(57) ABSTRACT

A self-aligned SiGe FinFET device features a relaxed channel region having a high germanium concentration. Instead of first introducing germanium into the channel and then attempting to relax the resulting strained film, a relaxed channel is formed initially to accept the germanium. In this way, a presence of germanium can be established without straining or damaging the lattice. Gate structures are patterned relative to intrinsic silicon fins, to ensure that the gates are properly aligned, prior to introducing germanium into the fin lattice structure. After aligning the gate structures, the silicon fins are segmented to elastically relax the silicon lattice. Then, germanium is introduced into the relaxed silicon lattice, to produce a SiGe channel that is substantially stress-free and also defect-free. Using the method described, concentration of germanium achieved in a structurally stable film can be increased to a level greater than 85%.

20 Claims, 10 Drawing Sheets

(51) Int. Cl.
*H01L 29/49* (2006.01)
*H01L 29/06* (2006.01)
*H01L 29/417* (2006.01)
*H01L 29/10* (2006.01)
*H01L 29/66* (2006.01)
*H01L 29/161* (2006.01)

(52) U.S. Cl.
CPC ...... *H01L 29/0649* (2013.01); *H01L 29/1054* (2013.01); *H01L 29/161* (2013.01); *H01L 29/41791* (2013.01); *H01L 29/495* (2013.01); *H01L 29/6656* (2013.01); *H01L 29/66545* (2013.01); *H01L 29/66795* (2013.01); *H01L 29/7849* (2013.01); *H01L 2029/7858* (2013.01)

(58) Field of Classification Search
CPC ............. H01L 29/0649; H01L 29/7849; H01L 29/161; H01L 29/0623; H01L 29/66795; H01L 2029/7858; H01L 29/7853–29/7854
USPC .......................................... 257/190; 438/424
See application file for complete search history.

(56) References Cited

U.S. PATENT DOCUMENTS

| | | |
|---|---|---|
| 2007/0221956 A1 | 9/2007 | Inaba |
| 2008/0064197 A1 | 3/2008 | Zhu et al. |
| 2008/0296615 A1 | 12/2008 | Savage et al. |
| 2012/0074464 A1 | 3/2012 | Cea et al. |
| 2012/0104472 A1 | 5/2012 | Xu et al. |
| 2012/0168830 A1 | 7/2012 | Usuda et al. |
| 2013/0193446 A1* | 8/2013 | Chao ................. H01L 29/66795 257/77 |
| 2014/0099774 A1 | 4/2014 | Vincent |
| 2014/0175554 A1 | 6/2014 | Loubet et al. |
| 2014/0339643 A1 | 11/2014 | Cheng et al. |
| 2015/0255543 A1 | 9/2015 | Cheng et al. |
| 2015/0263097 A1 | 9/2015 | Cheng et al. |
| 2015/0279970 A1 | 10/2015 | Zhang |
| 2016/0064483 A1* | 3/2016 | Kelly ................. H01L 29/0847 257/401 |
| 2016/0163648 A1* | 6/2016 | Peter ................. H01L 21/28518 257/754 |
| 2016/0172462 A1* | 6/2016 | Cheng ................. H01L 29/6681 257/192 |
| 2016/0190303 A1 | 6/2016 | Liu et al. |
| 2016/0190304 A1 | 6/2016 | Morin et al. |
| 2016/0190325 A1 | 6/2016 | Liu et al. |
| 2016/0276478 A1* | 9/2016 | Pawlak ............. H01L 29/0607 |
| 2016/0343734 A1* | 11/2016 | Doris ................. H01L 27/1211 |
| 2016/0372383 A1* | 12/2016 | Basker ................. H01L 21/845 |
| 2017/0200653 A1 | 7/2017 | Loubet et al. |

* cited by examiner

SELF-ALIGNED SILICON GERMANIUM FINFET WITH RELAXED CHANNEL REGION

JOINT RESEARCH AGREEMENT

The subject matter claimed herein was made as a result of activities undertaken within the scope of a joint research agreement. The parties to the joint research agreement are (1) STMicroelectronics, Inc., and (2) International Business Machines Corporation.

BACKGROUND

Technical Field

The present disclosure generally relates to techniques for fabricating an array of high performance FinFET devices.

Description of the Related Art

Advanced integrated circuits often feature strained channel transistors, silicon-on-insulator (SOI) substrates, FinFET structures, or combinations thereof, in order to continue scaling transistor gate lengths below 20 nm. Such technologies allow the channel length of the transistor to shrink while minimizing detrimental consequences such as current leakage and other short channel effects.

A FinFET is an electronic switching device in which a conventional planar semiconducting channel is replaced by a semiconducting fin that extends outward from the substrate surface. In such a device, the gate, which controls current flow in the fin, wraps around three sides of the fin so as to influence current flow from three surfaces instead of one. The improved control achieved with a FinFET design results in faster switching performance and reduced current leakage than is possible with a planar transistor. FinFETs are described in further detail in U.S. Pat. No. 8,759,874, and U.S. Patent Application Publication US2014/0175554, assigned to the same assignee as the present patent application.

Strained silicon transistors have been developed to increase mobility of charge carriers, i.e., electrons or holes, passing through a semiconductor lattice. Incorporating strain into the channel of a semiconductor device stretches the crystal lattice, thereby increasing charge carrier mobility in the channel so that the device becomes a more responsive switch. Introducing a compressive strain into a PFET transistor tends to increase hole mobility in the channel, resulting in a faster switching response to changes in voltage applied to the transistor gate. Likewise, introducing a tensile strain into an NFET transistor tends to increase electron mobility in the channel, also resulting in a faster switching response.

There are many ways to introduce tensile or compressive strain into transistors, for both planar devices and FinFETs. Such techniques typically entail incorporating into the device epitaxial layers of one or more materials having crystal lattice dimensions or geometries that differ slightly from those of the silicon substrate. The epitaxial layers can be made of doped silicon or silicon germanium (SiGe), for example. Such epitaxial layers can be incorporated into source and drain regions, into the transistor gate that is used to modulate current flow in the channel, or into the channel itself, which is a portion of the fin. For example, one way to introduce strain is to replace bulk silicon from the source and drain regions, or from the channel, with silicon compounds such as silicon germanium. Because Si—Ge bonds are longer than Si—Si bonds, there is more open space in a SiGe lattice. Electrons thus move more freely through a lattice that contains elongated Si—Ge and Ge—Ge bonds than through a lattice that contains shorter Si—Si bonds. The presence of germanium atoms having longer bonds tends to stretch the lattice, causing internal strain. Replacing silicon atoms with SiGe atoms can be accomplished, for example, during a controlled process of epitaxial crystal growth, in which a new SiGe crystal layer is grown from the surface of a bulk silicon crystal, while maintaining the same crystal structure of the underlying bulk silicon crystal. Alternatively, strain can be induced in the fin from below the device by using various types of SOI substrates. An SOI substrate features a buried insulator, typically a buried oxide layer (BOX) underneath the active area. SOI FinFET devices have been disclosed in patent applications assigned to the present assignee, for example, U.S. Patent Application Publication No. 2015/0279970, entitled "SOI FinFET Transistor with Strained Channel," which is hereby incorporated by reference in its entirety.

BRIEF SUMMARY

Strain and mobility effects in the channel of a FinFET can be tuned by controlling the size and the elemental composition of the fins. It is advantageous for SiGe films to contain a high concentration of germanium, e.g., in the range of at least 25%-40%, to provide enhanced electron mobility compared with lower concentration SiGe films. Carrier mobility in the channel region determines overall transistor performance. Consequently, it is desirable to increase to a level as high as possible the percent concentration of germanium atoms in the fins of a SiGe FinFET.

While a strained silicon lattice is beneficial, creating strain by incorporating germanium atoms using existing methods tends to damage the crystal lattice. As a result, the lattice structures of germanium-rich films tend to be mechanically unstable, especially if they contain a high number of structural defects such as faults, or dislocations. Furthermore, such a mechanically unstable fin may be structurally limited with regard to its aspect ratio, or height:width ratio. Such a limitation is undesirable because one advantage of a FinFET is that the fin, being a vertical structure, has a small footprint.

Dislocation defects that cause such instability can be avoided by creating a germanium-rich film that is relaxed, as an alternative to a strained film. A self-aligned SiGe FinFET device described herein features a relaxed channel region having a high germanium concentration. Instead of first introducing germanium into the channel and then attempting to relax the resulting strained film, a relaxed channel is formed initially to accept the germanium. Thus, a presence of germanium can be established without straining or damaging the lattice. In the CMOS FinFET fabrication method described herein, sacrificial gate structures are patterned relative to intrinsic silicon fins, to ensure that the gates are properly aligned, prior to introducing germanium into the fin lattice structure. After aligning the gate structures, the silicon fins are segmented to elastically relax the silicon lattice. Then, germanium is introduced into the relaxed silicon lattice, to produce a SiGe channel that is substantially stress-free and also defect-free. Because stress cannot build up in a segmented fin that has a small volume, lattice defects simply do not emerge when the germanium is introduced. In this way, the concentration of germanium achieved in a structurally stable film can be increased to a level greater than 85%, producing a film that is nearly pure germanium.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIGS. 2A-10C are different views of a FinFET array after completing each processing step of the method illustrated in FIG. 1. FIGS. 2A, 3A, 4A, 5A, 6A, 8A, 9A, and 10A are corresponding cross-sectional views of the FinFET array, cut across the fins. FIGS. 2C, 3C, 4C, 5C, 6C, 8C, 9C, and 10C are corresponding cross-sectional views of the FinFET array, cut along the fins.

FIGS. 2A-2C show the FinFET array following formation of three fins according to one embodiment as described herein.

FIGS. 3A-3C show the FinFET array following formation of four gate structures that wrap around three sides of each fin according to one embodiment as described herein.

FIGS. 4A-4C show the FinFET array after segmenting the fins to create channel regions having a relaxed lattice, according to one embodiment as described herein.

FIGS. 5A-5C show the FinFET array after filling spaces between the gate structures with an oxide, according to one embodiment as described herein.

FIGS. 6A-6C show the FinFET array after removal of sacrificial polysilicon gates from the gate structures, according to one embodiment as described herein.

FIGS. 8A-8C show the FinFET array after replacing the polysilicon gates with metal gates.

FIGS. 9A-9C show the FinFET array after formation of source and drain regions that include epitaxial extensions.

FIGS. 10A-10C show the FinFET array after formation of source and drain contacts.

DETAILED DESCRIPTION

Figure 1:
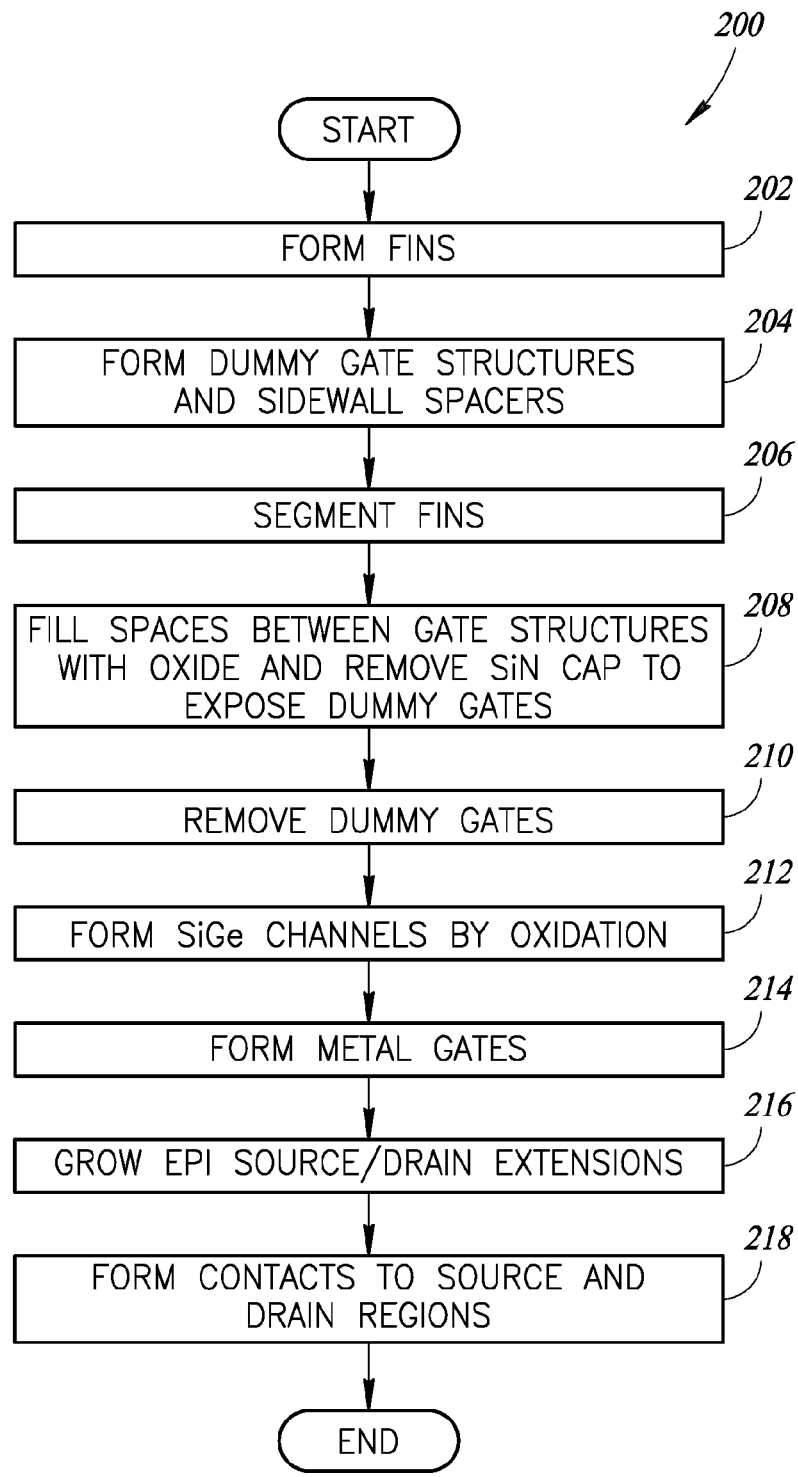
FIG. 1 is a flow diagram summarizing a sequence of processing steps in a method that can be used to fabricate self-aligned FinFETs having SiGe channels that are substantially free of crystalline structure defects, according to one embodiment as described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to self-aligned SiGe FinFET devices that have been produced; however, the present disclosure and the reference to certain materials, dimensions, and the details and ordering of processing steps are exemplary and should not be limited to those shown.

Turning now to the figures, FIG. 1 shows an exemplary sequence of steps in a method 200 of fabricating a self-aligned SiGe FinFET, according to one embodiment. Steps 202-218 in the method 200 are illustrated in FIGS. 2A-10C and described below. In each set of Figures, B is a top plan view, A is a cross-sectional view along a fin, and C is a cross-sectional view across the fins, as indicated by cut lines shown in the top plan view.

Figure 2A:
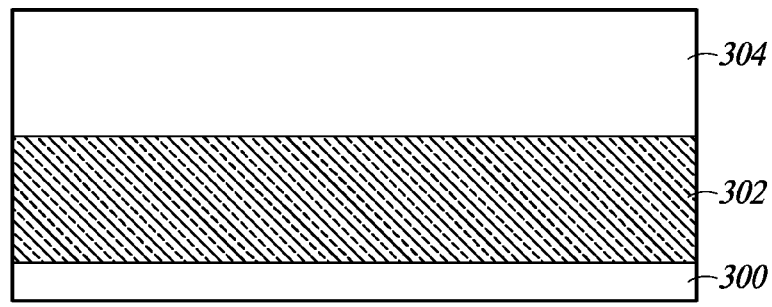
Figure 2B:
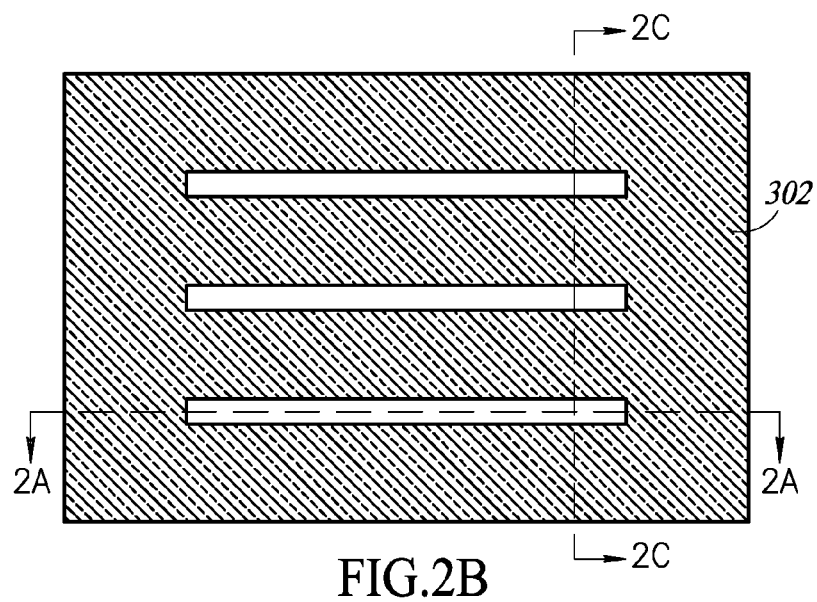
FIGS. 2B, 3B, 4B, 5B, 6B, 8B, 9B, and 10B are top plan views of the FinFET array.
Figure 2C:
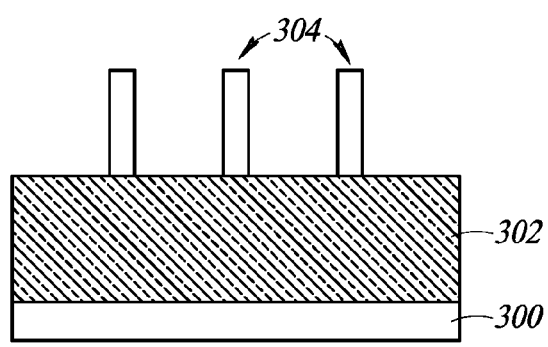

At 202, fins 304 are formed on a silicon-on-insulator substrate, according to one embodiment as shown in FIGS. 2A-2C. The SOI substrate includes an active layer over a buried oxide (BOX) layer 302, on a silicon substrate 300. The thickness of the active layer can be anywhere within a wide range of about 5-500 nm. SOI wafers are standard starting materials commonly used in the semiconductor industry. Alternatively, the BOX layer 302 can be formed on a bulk silicon wafer by growing, in a diffusion furnace, a thick oxide, typically 80-120 nm, as is well known in the art. Or, the substrate starting material can be a pre-strained SOI (sSOI) substrate or a SiGe-on-insulator (SGOI) substrate, in which the active layer is SiGe instead of silicon.

The fins 304 can be patterned from the active layer in a conventional fashion using direct photolithography and etching with SiN hard mask. Alternatively, the fins 304 can be formed using, for example, a sidewall image transfer (SIT) process as described in greater detail in U.S. Patent Application Publication No. 2014/0175554, assigned to the same assignee as the present patent application.

The sidewall image transfer process is capable of defining very high aspect ratio fins 304 using silicon nitride (SiN) sidewall spacers as a hard mask, instead of patterning the fins 304 using a photolithography mask. According to the sidewall image transfer technique, a mandrel, or temporary structure, is formed first, and then silicon nitride is deposited conformally over the mandrel and planarized to form sidewall spacers on the sides of the mandrel. Then the mandrel is removed, leaving behind a pair of narrow sidewall spacers that serve as a mask to create a pair of silicon fins 304. By either method, the fins 304 extend vertically outward from a top surface of the substrate as shown in FIG. 2C. The height of the fins 304 is desirably in the range of about 20-200 nm. In one embodiment, the fins formed on an SOI wafer are 50 nm tall. In another embodiment, fins formed on a bulk silicon wafer are 100 nm tall. The width of the fins 304 is desirably in the range of about 5-20 nm. Accordingly, corresponding aspect ratios of the fins are in the range of about 4-10. The resulting high aspect ratio fins 304 are shown in FIGS. 2A, 2B, and 2C.

Figure 3A:
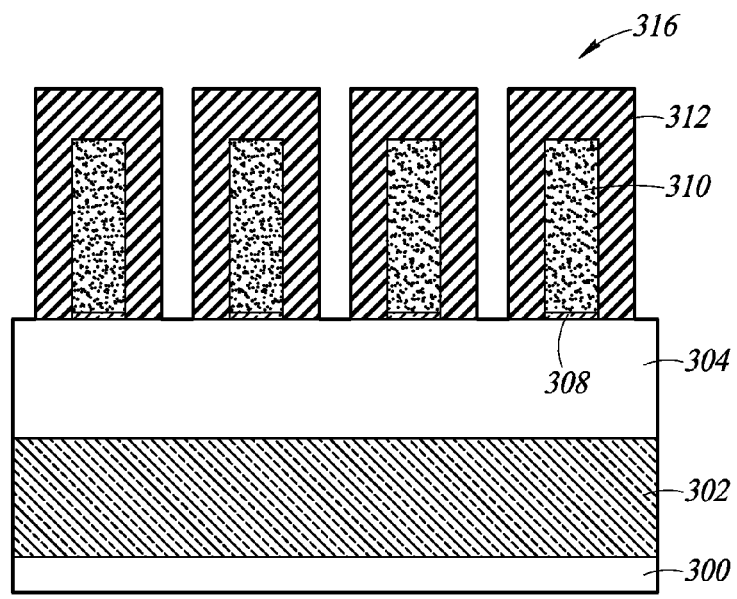
Figure 3B:
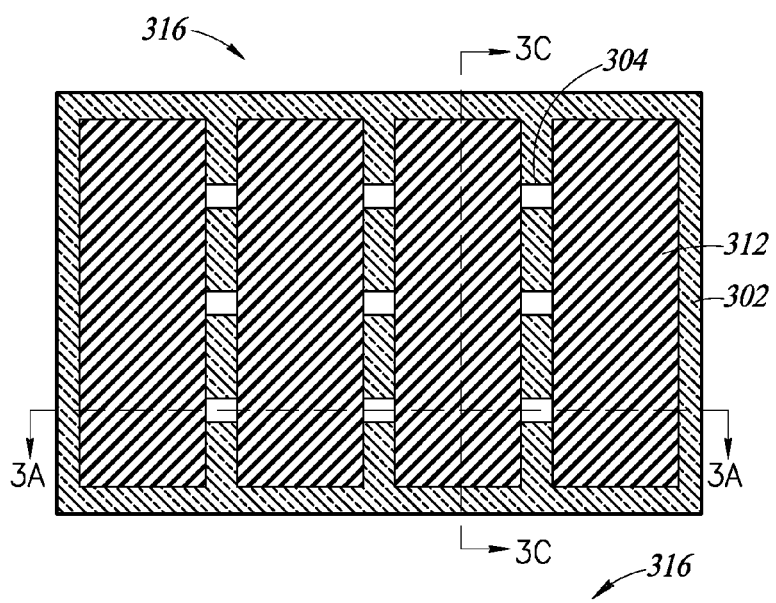
Figure 3C:
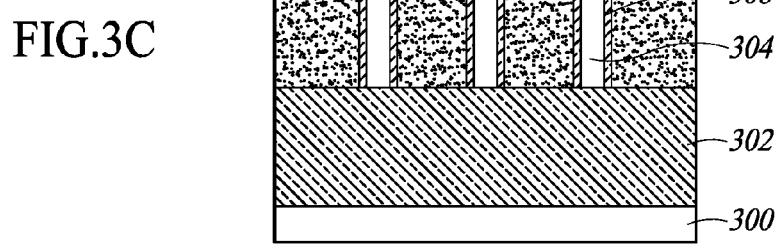

At 204, dummy gate structures 316 are formed in a transverse direction relative to the fins 304, according to one embodiment, as shown in FIGS. 3A-3C. Formation of the dummy gate structures 316 is part of a replacement metal gate (RMG) process well known in the art of semiconductor processing. In the RMG process, the dummy gate structures 316, made of polysilicon, are later replaced with a permanent metal gate structure. An RMG process is described in greater detail in U.S. Patent Application Publication No. 2014/0175554.

The dummy gate structures 316 include a thin gate oxide 308, a sacrificial gate 310, a hard mask cap 312, and a pair of sidewall spacers 314. First, the gate oxide 308 is conformally deposited to cover the fins 304. The gate oxide 308 is desirably made of a 3-5 nm thick high-k gate material such as, for example, $SiO_2$ or $HfO_2$, as is well known in the art. Next, a layer of amorphous silicon or polysilicon is deposited and patterned using a silicon nitride hard mask to form the sacrificial gates 310. If amorphous silicon is used in the sacrificial gates 310, the amorphous silicon material can be transformed into polysilicon by annealing at a later step. The dummy gate structures 316 are then aligned to the fins 304 such that the dummy gate structures 316 are in contact with three sides of the fins, as shown in FIG. 3C. The sacrificial gate 310 has a height in the range of about 50-100 nm and a width in the range of about 15-25 nm, desirably about 20 nm. The hard mask used to pattern the sacrificial gate 310 is in the range of 20-100 nm thick. The dummy gate structures 316 are shown in FIGS. 3A, 3B, and 3C, covered by the hard mask cap 312 and sidewall spacers 314.

The sidewall spacers 314 are formed on the sacrificial gate 310 by depositing and patterning a layer of dielectric material, e.g., silicon dioxide ($SiO_2$), silicon nitride (SiN), SiBCN, silicon oxynitride (SiON), SiOCN, silicon carbonate (SiOC), or the like. In one embodiment, SiN sidewall spacers 314 are formed on the sides of the sacrificial gate 310 by atomic layer deposition (ALD). The ALD process deposits SiN conformally over the sacrificial gate 310, and on top of the fins 304. Following deposition, the SiN can be etched anisotropically in the usual way using an RIE process to remove SiN on the horizontal surfaces between the gate structures 316 while leaving the SiN cap 312 on top of the sacrificial gates 310 and SiN on the sidewalls of the sacrificial gates 310. The SiN sidewall spacer thickness is desirably in the range of about 5-20 nm.

Figure 4A:
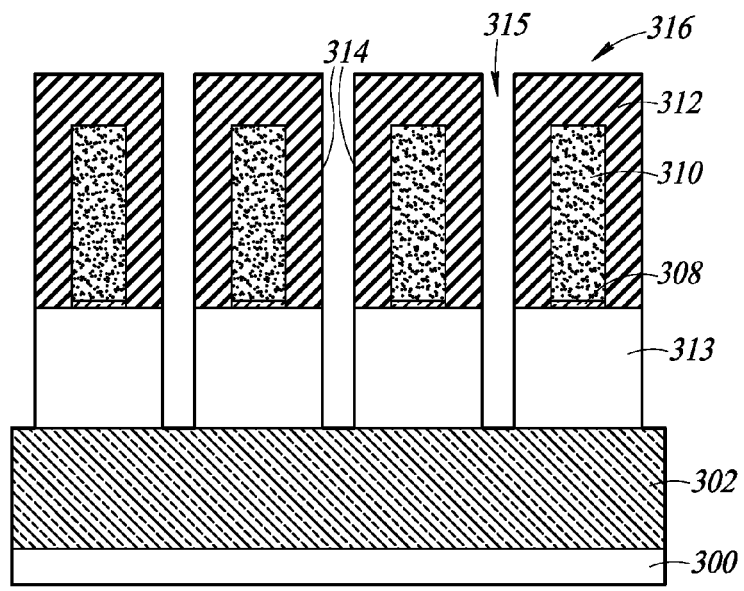
Figure 4B:
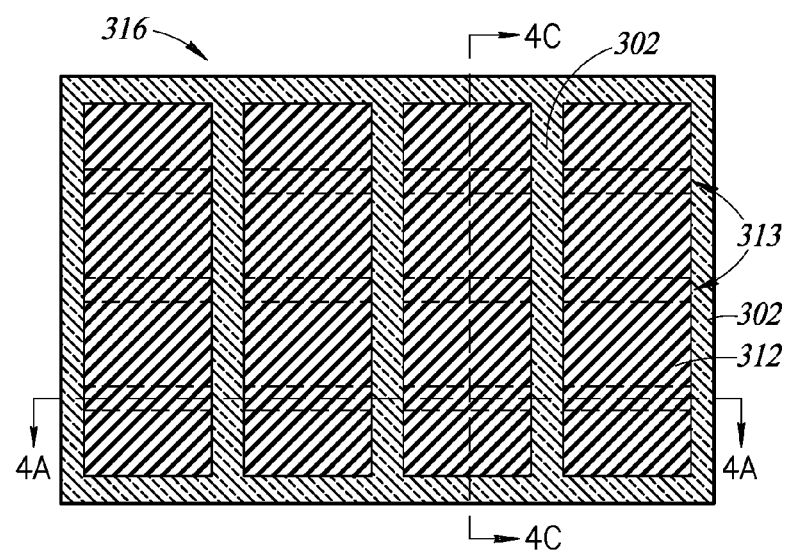
Figure 4C:
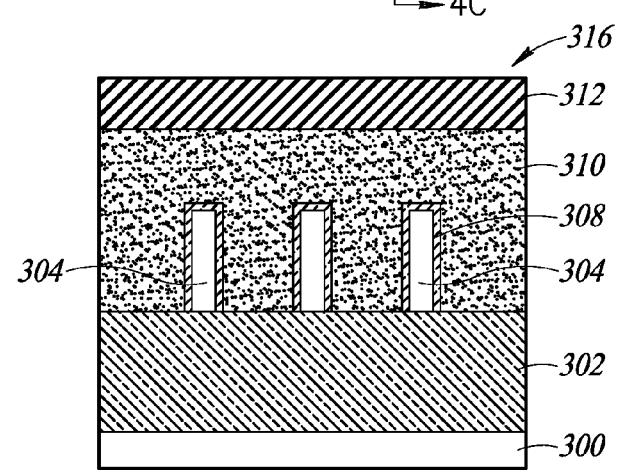

At 206, the fins 304 are segmented, according to one embodiment, as shown in FIGS. 4A-4C. Segmentation of the fins 304 can be accomplished by conventional etching with an etching chemistry that is selective to the dielectric sidewall spacers 314 or, alternatively, by a SIT process as described above. The fin segments 313 are cut so as to be spaced at regular intervals as shown in FIGS. 4A, 4B, and 4C, such that the dummy gate structures 316 are centered on the fin segments 313. The fin segment lengths are in the range of about 20-100 nm, and the fin segments 313 are spaced apart by gaps 315 of about 10 nm. Accordingly, the footprint area of a fin segment 313 is in the range of about 100-2000 $nm^2$. The resulting fin segments 313 have an elastically relaxed silicon lattice in which dislocation defects will not tend to accumulate. Even if the fin is made of strained silicon or SiGe, the fin may be fully relaxed following segmentation. Unstrained silicon fins will tend to remain fully relaxed.

Figure 5A:
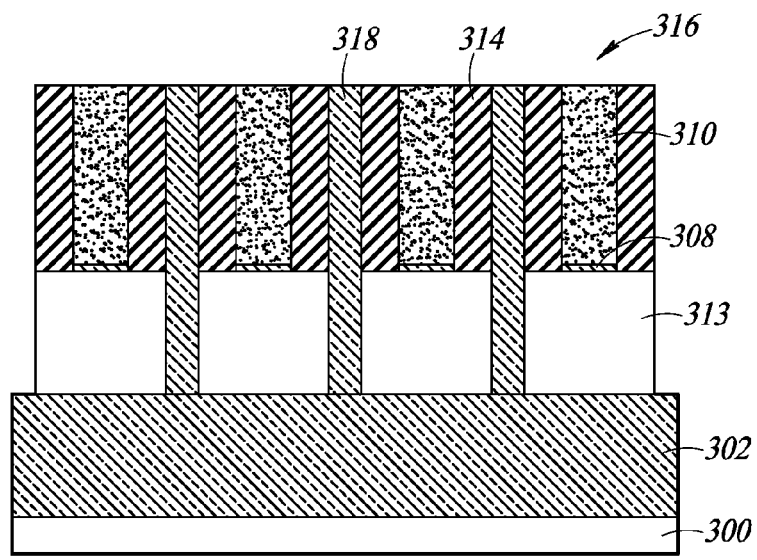
Figure 5B:
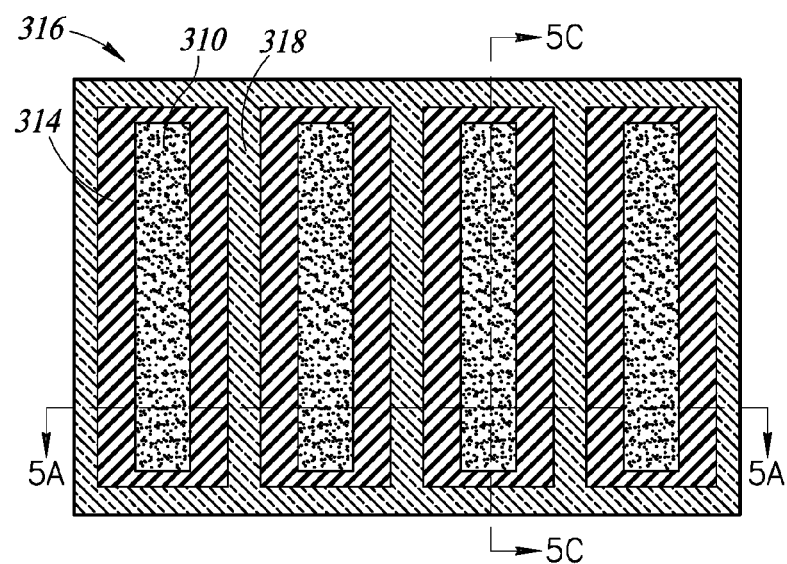
Figure 5C:
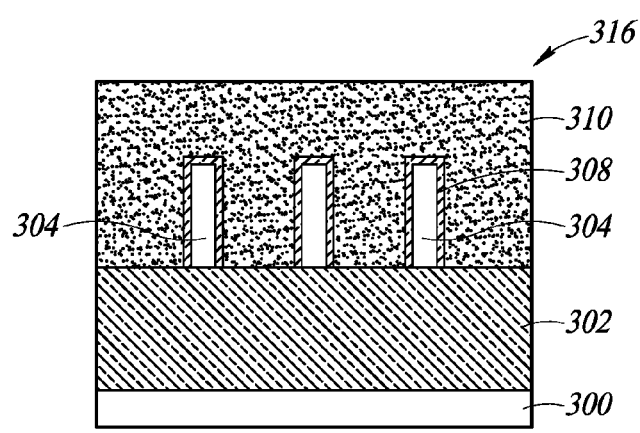

At 208, the gaps 315 separating the fin segments 313 are filled with oxide 318 according to one embodiment, as shown in FIGS. 5A-5C. The oxide 318 is planarized using a conventional CMP process that stops on the sacrificial gates 310, thereby removing the hard mask caps 312.

Figure 6A:
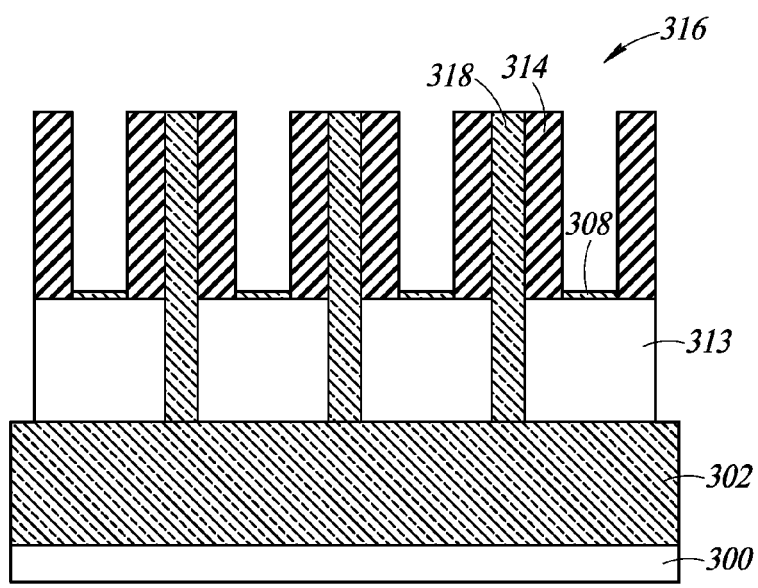
Figure 6B:
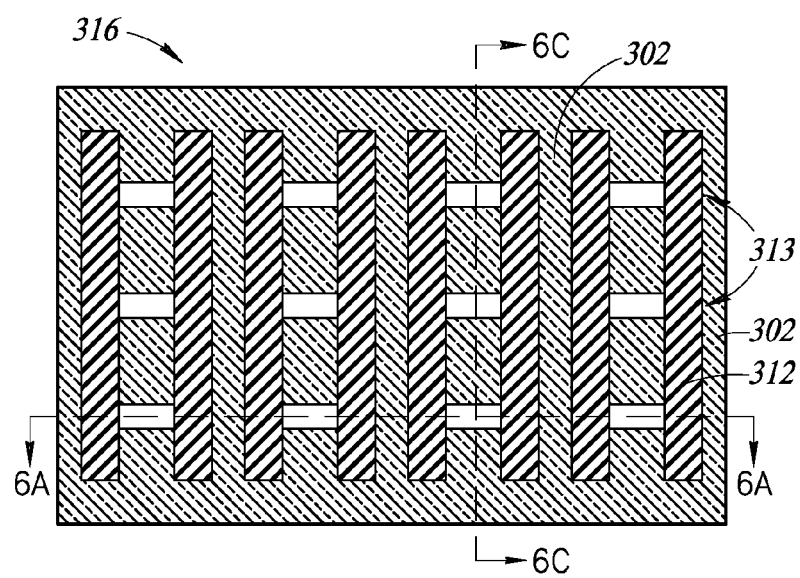
Figure 6C:
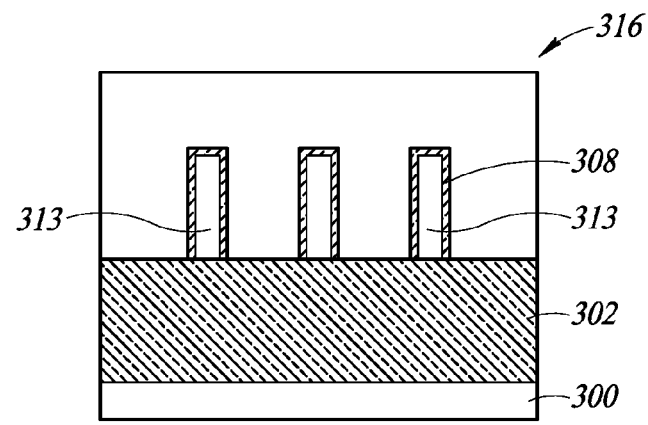

At 210, the sacrificial gates 310 are removed, according to one embodiment, as shown in FIGS. 6A-6C. Removal of the sacrificial gates 310 can be accomplished using a conventional wet chemical etchant such as, for example, hot ammonia, followed by an HF treatment to remove the gate oxide 308 as well.

Figure 7A:
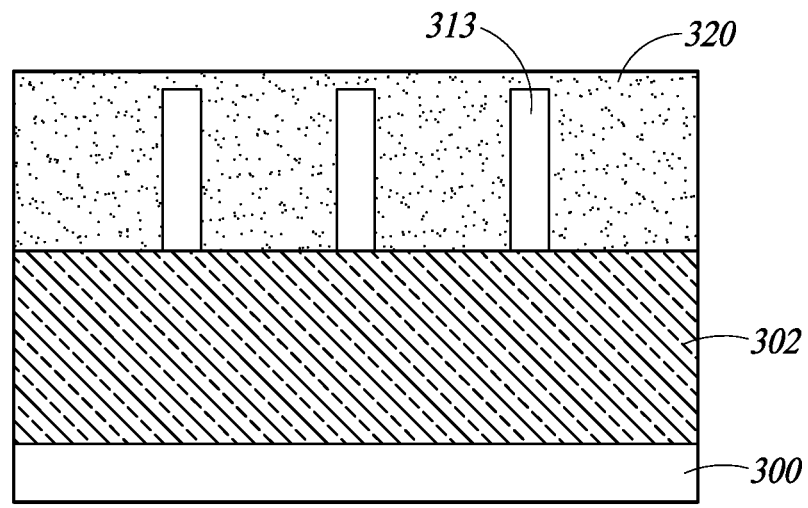
FIG. 7A is a cross-sectional view of the FinFET array, cut across the fins, after formation of an overlying film that contains germanium, according to one embodiment as described herein.
Figure 7B:
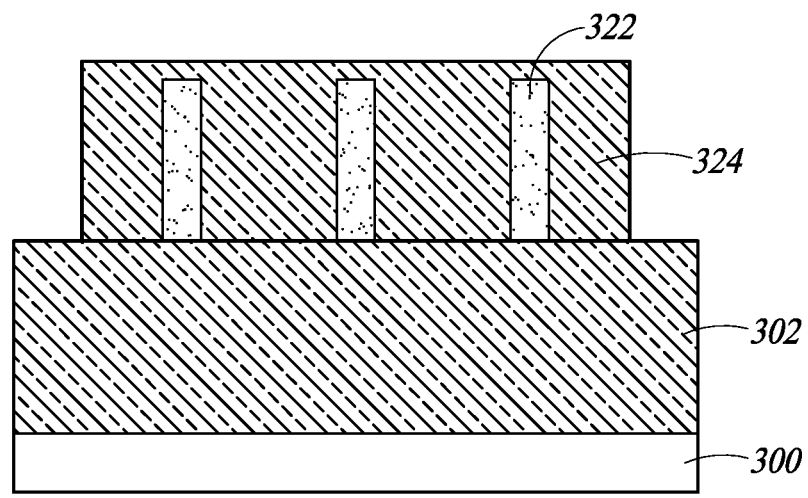
FIG. 7B is a cross-sectional view of the FinFET array, cut across the fins, after germanium is incorporated into the fin segments, according to one embodiment as described herein.

At 212, the silicon in segments 313 are transformed into SiGe-rich fin segments 322 using an oxidizing condensation process, according to one embodiment, as shown in FIGS. 7A and 7B. First, a cladding 320 is deposited over the silicon fin segments 313 as shown in FIG. 7A. Alternatively, the cladding 320 can be epitaxially grown outward from the top and the sides of the fin segments 313. The cladding 320 can be, for example, a crystalline or amorphous form of SiGe that will serve as a source of germanium for creating the SiGe-rich fin segments 322. Next, the cladding 320 is exposed to an oxygen-rich environment that forms $GeO_2$ at the surface of the silicon fin segments 313. However, the chemical bonds of GeO$_2$ tend to be unstable, allowing the underlying silicon in the fin segments 313 to react with the GeO$_2$ to form SiGe and SiO$_2$. This oxidation reaction effectively causes the germanium to condense into the silicon fin segments 313, producing SiGe fin segments 322 that are rich in SiGe and surrounded by oxide 324, as shown in FIG. 7B. The resulting SiGe-rich fin segments 322 have a substantially uniform structure in which germanium atoms are incorporated throughout the silicon crystal lattice with a concentration that exceeds 85%.

Alternatively, the cladding 320 can be made of pure germanium, or a III-V material such as, for example, indium phosphide (InP), indium gallium arsenide (InGaAs), or the like.

More generally, fin segments 322 that incorporate a second semiconductor material can be produced by other processes such as epitaxial growth, a combination of epitaxy and the condensation process described above, or a combination of epitaxy and diffusion. Regardless of the technique used to introduce new materials into channels, the resulting fin segments 322 remain fully relaxed because stress cannot accumulate within the small volume of the small footprint, high aspect ratio fins.

Figure 8A:
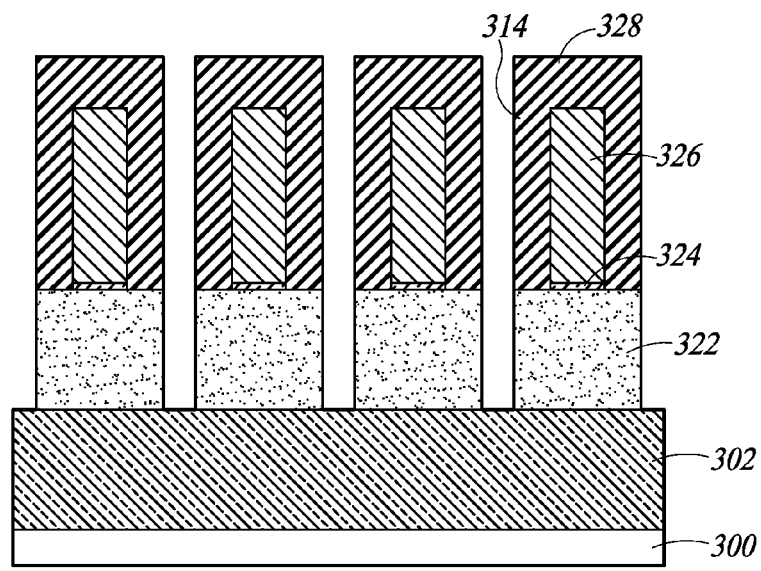
Figure 8B:
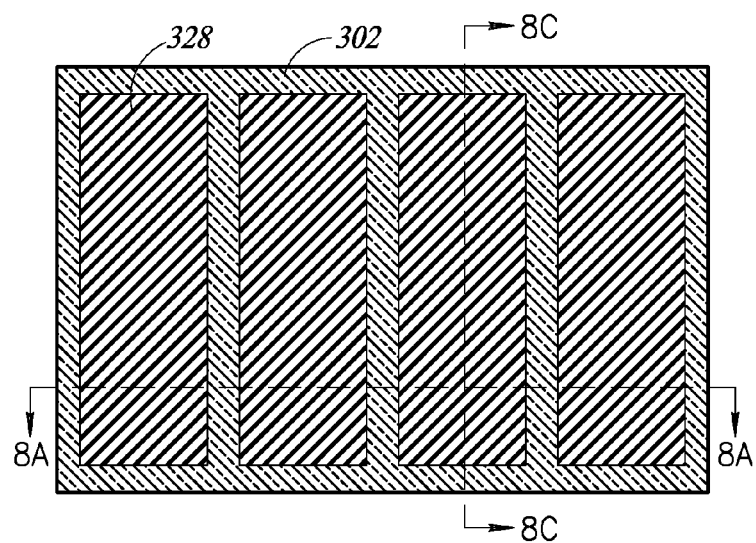
Figure 8C:
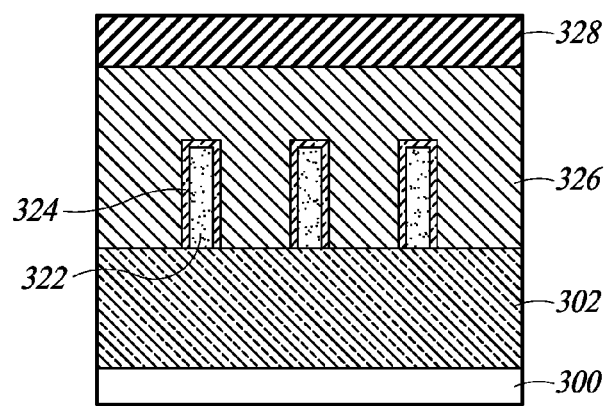
Figure 9A:
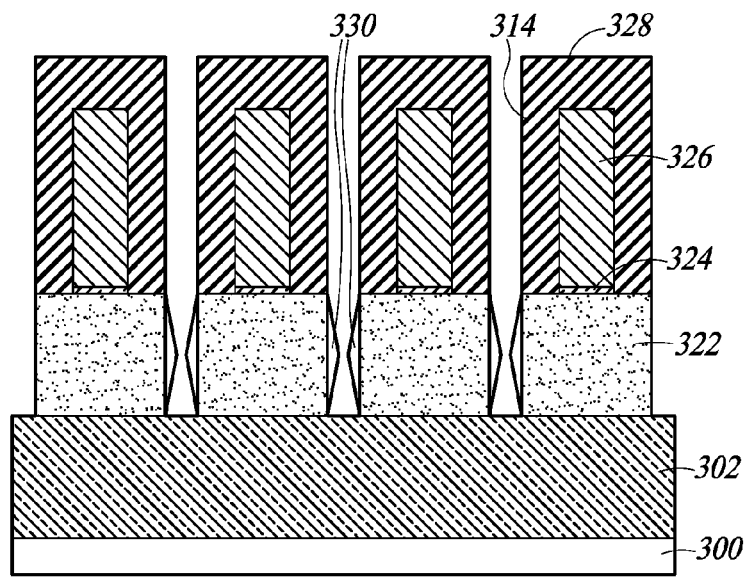
Figure 9B:
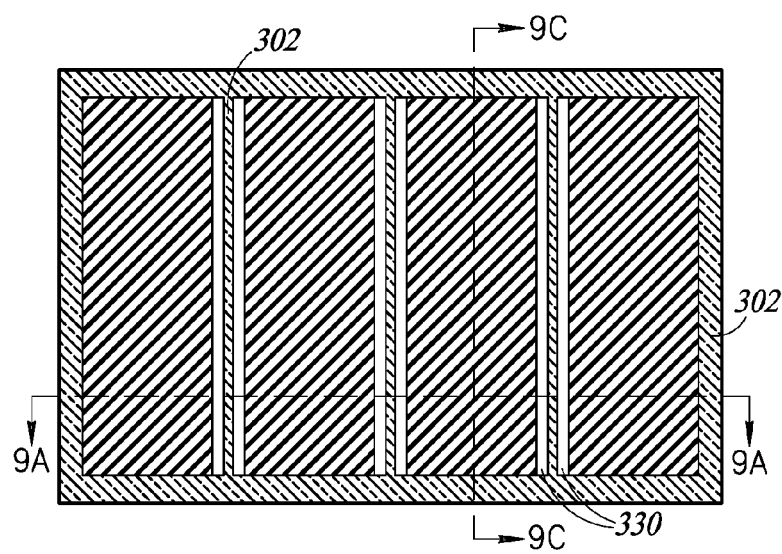
Figure 9C:
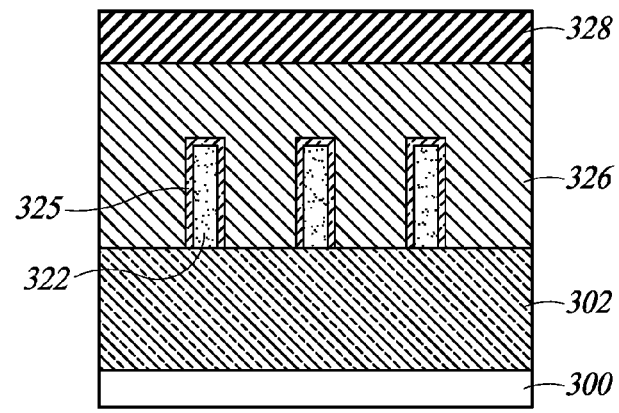

At 214, a thin low-k dielectric material such as, for example, HfO$_2$, and metal gates 326 are formed on the new fin segments 322 according to one embodiment as shown in FIGS. 8A-8C. The metal gates 326 are deposited between the pairs of sidewall spacers 314 in a self-aligned process. The gate stack metals may include those typically used in metal gate processes, e.g., tungsten (W), titanium (Ti), titanium nitride (TiN), work function materials, and the like. A hard mask cap 328 is formed over the metal gates 326. During subsequent contact formation, the oxide 318 separating the gates is recessed down to the base of the fin segments 322. It is noted that each metal gate 326 is substantially centered over a fin segment 322. Portions of the fin segments 322 that are located directly underneath the metal gates 326 will serve as transistor channels, while portions of the fin segments 322 outside the influence of the metal gates 326 will serve as source and drain regions of the devices.

At 216, source and drain extensions 330 are grown epitaxially on the sidewalls of the fin segments 322. First, the SiN sidewall spacers 314 are trimmed using a wet chemical process such as, for example, phosphoric acid (H$_3$PO$_4$), which will remove SiN selectively to oxide and silicon. Alternatively, an HF-EG wet etch process can be used in which hydrofluoric acid (HF) and ethylene glycol (EG) are combined to form a chemical mixture that removes both SiN and SiO$_2$ at substantially equal rates. The HF-EG formulation is advantageous in that it has a slow etch rate compared with HF alone that provides superior process control when etching either SiN or SiO$_2$. If HF-EG is used, a small amount of the BOX, approximately 5 nm, may be eroded without substantial impact on the device integrity.

Figure 10A:
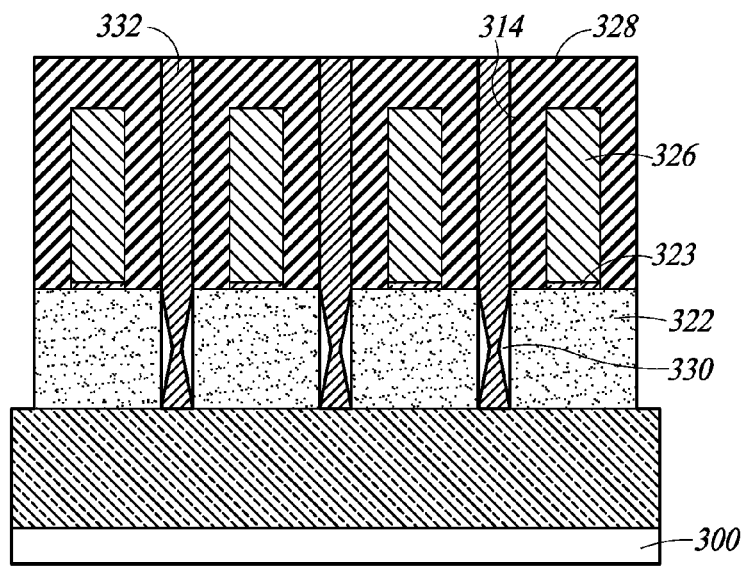

Then, the source and drain extensions 330 are formed by selective epitaxy of SiGe, silicon carbide (SiC), or group V materials from sidewalls of the fin segments 322. The source and drain extensions 330 extend outward from the ends of each fin segment 322, expanding the fin segment at acute angles relative to a vertical axis of the fin segment 322 to produce diamond-shaped structures, as shown in FIG. 10A. The source and drain extensions 330 may be doped in-situ with boron (B), phosphorous (P), or arsenic (As), to produce p-type or n-type devices, respectively, in the usual way.

Figure 10B:
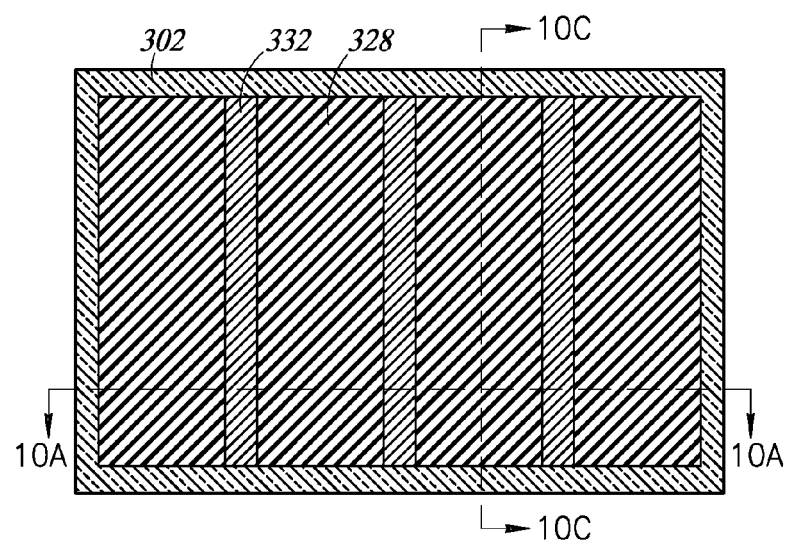
Figure 10C:
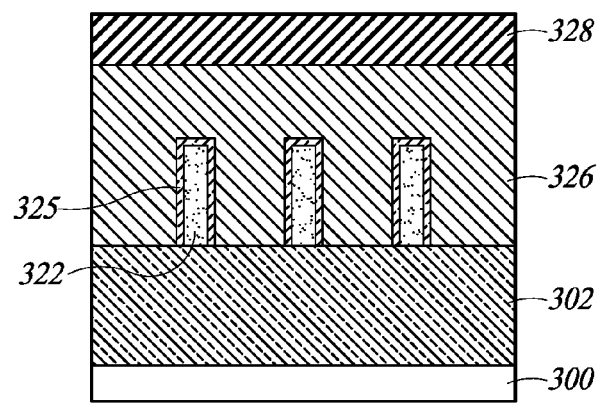

At 218, metal contacts 332 to the source and drain regions and to the source and drain extensions 330 are formed according to one embodiment, as shown in FIGS. 10A-10C. Formation of the metal contacts 332 uses conventional methods in which a metal liner is first deposited and reacts with the silicon to form a metal silicide. Then, a bulk contact metal is deposited in the usual way, and planarized to stop on the hard mask cap 328.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A FinFET array, comprising:
    a silicon substrate;
    a plurality of fin segments spaced at regular intervals on a surface of the silicon substrate, the plurality of fin segments including germanium having a concentration that exceeds 85%;
    a plurality of gate structures arranged in a transverse direction relative to the plurality of fin segments, each gate structure including a metal gate substantially centered over one of the plurality of fin segments; and
    source and drain extensions that extend from each of the fin segments at acute angles relative to a vertical axis of each fin segment.

2. The FinFET array of claim 1 wherein the plurality of fin segments are on a buried oxide layer.

3. The FinFET array of claim 1 wherein the plurality of fin segments have aspect ratios greater than 5.0.

4. The FinFET array of claim 1 wherein the plurality of fin segments have footprints smaller than 1000 nm$^2$.

5. The FinFET array of claim 1 wherein the plurality of fin segments are substantially free of lattice defects.

6. A device, comprising:
    a substrate including a first semiconductor material;
    a plurality of fins on the substrate, each fin including the first semiconductor material and a second semiconductor material;
    source and drain regions extending from sidewalls of the fins;
    a plurality of gate structures, each of the gate structures substantially centered over a respective fin and surrounding at least three sides of the respective fin; and
    a plurality of source and drain contacts positioned between adjacent ones of the plurality of gate structures and extending between adjacent ones of the source and drain regions.

7. The device of claim 6, further comprising a plurality of channel regions, each channel region being between respective source and drain regions of a respective fin.

8. The device of claim 6 wherein each gate structure includes a metal gate and sidewall spacers on a top surface of the respective fin, the sidewall spacers abutting side surfaces of the metal gate.

9. The device of claim 8 wherein the sidewall spacers are substantially aligned with sidewalls of the respective fin.

10. The device of claim 8 wherein the sidewall spacers include silicon nitride.

11. The device of claim 8 wherein the source and drain regions extend outwardly beyond side surfaces of the sidewall spacers.

12. The device of claim 6 wherein the plurality of source and drain contacts extend from a surface of the substrate to at least a top surface of the gate structures.

13. The device of claim 6 wherein the first semiconductor material is silicon and the second semiconductor material is germanium.

14. The device of claim 13 wherein a concentration of the germanium in the plurality of fins exceeds 85%.

15. The device of claim 6 wherein the second semiconductor material includes one or more of germanium, indium, phosphorous, gallium, and arsenic.

16. A device, comprising:
a substrate;
a plurality of fins on the substrate, each fin separated from an adjacent fin by a space, each fin including a channel, a source, and a drain;
source and drain extensions extending from sidewalls of each fin into the adjacent space;
a plurality of gate structures on the plurality of fins; and
a plurality of source and drain contacts, each of the source and drain contacts extending into the space separating respective adjacent fins.

17. The device of claim 16 wherein each of the plurality of source and drain contacts includes:
a first portion adjacent to the substrate; and
a second portion adjacent to the source and drain extensions, the first portion being wider than the second portion.

18. The device of claim 17 wherein each of the plurality of source and drain contacts further includes a third portion adjacent to the plurality of gate structures, the third portion being wider than the second portion.

19. The device of claim 16 wherein the source and drain extensions include one or more of silicon, germanium, carbon, gallium, arsenic, indium, phosphorous, and combinations thereof.

20. The device of claim 16 wherein the plurality of fins include germanium, and a concentration of the germanium in the fins exceeds 85%.

* * * * *